United States Patent [19]
Mok et al.

[11] Patent Number: 5,491,610
[45] Date of Patent: Feb. 13, 1996

[54] ELECTRONIC PACKAGE HAVING ACTIVE MEANS TO MAINTAIN ITS OPERATING TEMPERATURE CONSTANT

[75] Inventors: Lawrence S.-W. Mok, Brewster; Sampath Purushothaman, Yorktown Heights; Bahgat G. Sammakia, Newark Valley; Janusz S. Wilczynski, Ossining; Tien Y. Wu, Endwell, all of N.Y.

[73] Assignee: International Business Machines Corporation, Armonk, N.Y.

[21] Appl. No.: 303,804

[22] Filed: Sep. 9, 1994

[51] Int. Cl.⁶ ............................................. H05K 7/20
[52] U.S. Cl. ............................................. 361/695
[58] Field of Search ........................ 165/3, 22, 26–27, 165/32, 34, 40, 58, 80.2, 80.3, 185; 174/16.3; 236/49.3, 94, DIG. 3; 313/13; 361/687–688, 695–697, 717–722

[56] References Cited

U.S. PATENT DOCUMENTS 5,285,347   2/1994   Fox et al. .................................. 361/695

FOREIGN PATENT DOCUMENTS 8099821   6/1983   Japan .................................. 361/695
129524    8/1983   Japan .................................. 361/695
4130697   5/1992   Japan .................................. 361/695
4130698   5/1992   Japan .................................. 361/695

*Primary Examiner*—Gregory D. Thompson
*Attorney, Agent, or Firm*—Scully, Scott, Murphy & Presser

[57] ABSTRACT

An electronic package having an active cooling system for maintaining a semiconductor chip at approximately a constant temperature by monitoring the present temperature of the chip and varying the air flow over a heat sink in thermal contact with the chip in response to the temperature. In addition, the temperature difference between the semiconductor chip module and a printed circuit board is also monitored to maintain that difference at a preset value. The air flow is varied by a variable speed fan or a variable direction baffle.

10 Claims, 1 Drawing Sheet

ELECTRONIC PACKAGE HAVING ACTIVE MEANS TO MAINTAIN ITS OPERATING TEMPERATURE CONSTANT

BACKGROUND OF THE INVENTION

1. Field of the Invention

The present invention relates to a semiconductor package cooling and more particularly to an apparatus and method for providing a variable rate of cooling locally in the package to maintain a constant operating temperature.

2. Description of the Prior Art

Most high power CMOS logic chips planned for future computers are expected to operate under one or more power management schemes. In these schemes, portions of the on-chip circuits can be turned off when they are not needed or the clock rate can be reduced when the processing speed is not required. The overall power dissipation of the chip is thereby decreased and these reductions can occur in a cyclic fashion with time periods on the order of hundreds of seconds. Since the cooling rate of the packages is generally constant, this means that the chip temperature can fluctuate corresponding to the chip power cycles. The temperature excursions of this kind will generate thermal fatigue damage in the packaging materials especially the printed circuit board interconnections.

Semiconductor package cooling systems are well known in the art. Variable speed fans controlled by a temperature sensor are disclosed in U.S. Pat. Nos. 5,121,291, 5,102,040, 4,817,865 and 4,664,542, as well as in research disclosures RD 31094 dated 2/90 and RID 26947 dated 9/86, and IBM Technical Disclosure Bulletins Vol. 32 No. 10A dated 3/90 and Vol. 26 No. 4 dated 9/83.

U.S. Pat. No. 5,121,291 discloses a cooling system with exhaust and intake fans, the speeds of which are controlled by the temperatures in the system. U.S. Pat. No. 5,102,040 discloses the use of the inlet air temperature and the temperature difference of the inlet and outlet air as the control parameters for the cooling fans. U.S. Pat. No. 4,817,865 discloses a cooling scheme of a modular system in which each modular compartment has a temperature sensor and the temperature reading is used to control the speed of a cooling fan. U.S. Pat. No. 4,664,542 discloses a control circuit design for a print head in which the temperature of the printing head is sensed and used to control the printing and fan speeds.

RD 31094 discloses a scheme to change the fan speed by detecting the presence of human operators around a system. RD 26947 discloses a memory-chip cooling scheme in which the speed of a fan is changed according to the electric current intake of the memory chips. IBM TDB Vol. 32 No. 10A discloses a fan design that has an air temperature sensor integrated within, such that the fan speed is adjusted to the surrounding air temperature.

IBM TDB Vol. 26 No. 4 discloses a speed control circuit for a DC fan using several temperature sensors. The highest temperature reading is used to control the fan supply voltage and hence the fan speed.

Attempts to provide local cooling within semiconductor packages have also been made.

U.S. Pat. No. 4,931,904 discloses a scheme to enhance local cooling to a board by adding fans or ducts to an adjacent board. The fan speed can be adjusted accordingly. U.S. Pat. No. 4,449,164 discloses a cooling scheme using longitudinal fins of a heat sink on a module and a tube surrounding the fins for guiding the air flow. SU 1476629 discloses an electronic unit having heat sinks placed between the PCB and heat elements, and baffles at the main coolant path to lead the coolant to the heat sinks. JA 0076299 discloses an electronic cabinet for housing a plurality of PCB's mounted vertically with thermosensitive shutters on the exhaust side of the cabinet. The shutters are normally closed if no PCB's are plugged in.

There is a need for a local active cooling system having a variable control system for use in the power management environment of excessive on-off cycles to maintain semiconductor chips at an appropriate constant temperature.

SUMMARY OF THE INVENTION

The present invention is directed to a package structure for maintaining a semiconductor chip at approximately a constant temperature in an environment where the power consumption of the chip is variable which comprises means for monitoring the present temperature of the chip and means for varying air flow over a heat sink in thermal contact with the chip. A control means connects the means for monitoring the present temperature of the chip to the means for varying the air flow such that the air flow is increased when the chip temperature increases and the air flow decreases as the chip temperature decreases. In accordance with the present invention, the means for varying the air flow includes a variable speed fan or alternatively a variable direction baffle and a constant speed fan. The means for monitoring the present temperature of chip may include temperature sensors on or near the chip or means for measuring the current supply to the chip and a control circuit for converting the current reading to a temperature based on a predetermined relationship.

In another embodiment of the present invention, the parameter used to control the variance of the air flow over the heat sink is the temperature difference between the semiconductor chip module and the printed circuit board on which the module is mounted. The temperature sensors are attached to the module and the printed circuit board and a control means monitors the temperature difference and regulates the air flow to maintain the difference to a preset value. In addition, a separate temperature sensor may also be in thermal contact with the chip or actually embedded in the chip so that the control means regulates the air flow over the heat sink in response to the chip temperature as well as the temperature difference between the module and the printed circuit board.

DETAILED DESCRIPTION OF THE INVENTION

Figure 1:
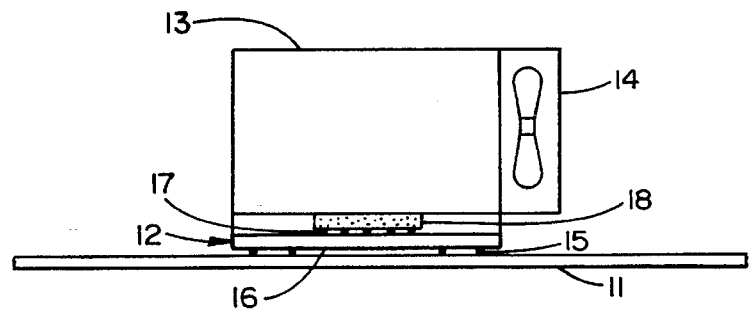
FIG. 1 is a schematic cross-sectional view of a semiconductor package having the local chip module cooling apparatus of the present invention.

Referring now to the drawings, FIG. 1 is a schematic layout of a single chip module. A single chip module 12 is soldered to a printed circuit board 11 using solder balls 15.

A semiconductor chip 18 is similarly connected to a substrate 16 by solder balls 17. There is a thermal interface material, typically thermally conducting composite paste, placed between the chip 18 and the metal cover the module 12. A heat sink 13 is mounted on the module 12. A fan 14 is attached directly to the heat sink 13. The location of where the fan is attached to the heat sink can be varied and more than one fan can be used. While solder balls 15 and 17 are shown as connection means between the chip and the printed circuit board, and the chip and the substrate, respectively, the means of connection are not limited to solder balls. Other interconnection means such as wire bond, TAB or pin grid arrays can also be used.

Figure 2:
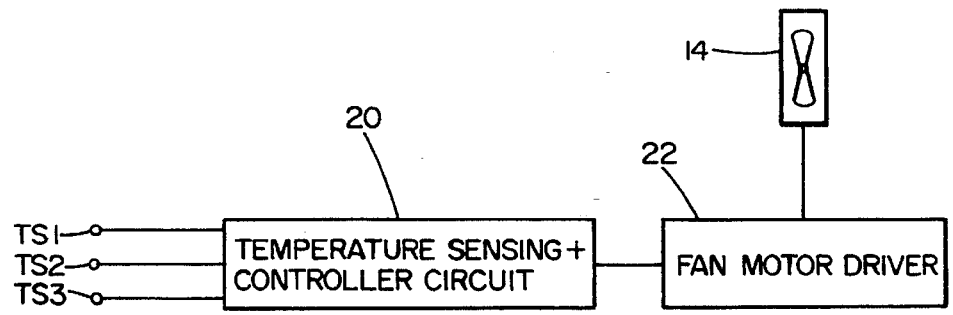
FIG. 2 is a schematic block diagram of the control circuit for controlling a variable speed fan in accordance with the present invention.

A simplified speed control block diagram is shown in FIG. 2. A temperature sensor TS1 is thermally attached to the chip 18. The sensor TS1 is coupled to temperature sensing and controller circuit 20. The controller, based on the increase or decrease of the temperature, changes the supply voltage to the fan motor driver 22. The rotational speed of the fan 14 will change according to the supply voltage thus varying the amount of air moving across the heat sink 13. When the temperature of chips 18 rises, the controller 20 will send out a signal to the fan motor driver 22 to raise the fan supply voltage. The rising voltage will drive more air across the heat sink 13 and increase the cooling rate. Likewise, the voltage will be reduced when the temperature of the chip 18 drops. A constant, preset operating temperature of the chip can thus be maintained regardless of the changes in the power dissipation of the chip. The controller 20 can be either analog or digital. If a digital version is used, the temperature information is first digitized and then processed digitally.

In an alternative embodiment, in addition to feeding the temperature of the chip 18 to the controller 20, temperature sensor TS2 can be attached to the substrate 16 for feeding the temperature of the substrate to the controller 20. In addition, temperature sensor TS3 can be attached to the printed circuit board 11 for feeding the temperature of board to the controller 20. In these methods, the controller 20 will change the supply voltage to the fan motor driver in response to the highest of the temperatures sensed by the multiple sensors.

In a further alternative embodiment, temperature sensor TS2 is attached to the module 12 and the temperature sensing circuit will monitor the temperature difference between the module 12 and the printed circuit board 11 as sensed by sensors TS2 and TS3. The controller circuit 20 will change the supply voltage to the fan motor driver 22 in order to maintain that the temperature differential at a preset value. Inasmuch as the coefficient of thermal expansion of the board 11 and module 12 are different, thermal fatigue due to repeated temperature cycling will be significantly reduced or eliminated by maintaining this temperature difference at a preset value such that the absolute displacement of board 11 and module 12 is substantially zero. In this embodiment, the temperature sensor TS1 to the chip is optional and may be provided as an additional control means whereby supply voltage to the fan motor driver will be adjusted to both maintain the temperature difference between the circuit board and the module 12 at a preset value while also maintaining the temperature of chip at a predetermined constant. Control circuitry for adjusting the fan motor driver supply voltage based on these various parameters is well known in the art and therefore there is no need to disclose same.

Figure 3:
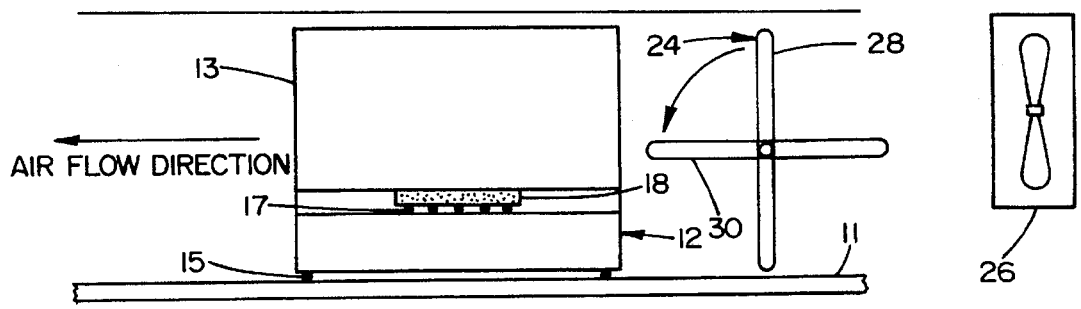
FIG. 3 is a schematic cross-sectional view of a semiconductor package having a variable direction baffle in accordance with the present invention.

In another embodiment of the present invention, chip temperature can be controlled by an active air flow deflector or baffle near each module based on the same control variants as set forth above. FIG. 3 is a schematic cross-sectional diagram of a single chip module in which deflector 24 is positioned between heat sink 13 and a fan 26. The orientation of the air deflectors is used to regulate the amount of air flow in the area of a particular chip based on the chip temperature. Deflector 24 is rotated from a closed position shown at 28 to various intermediate positions as required with extreme open position at 30. In this embodiment, the control circuit 20 is connected to the deflector motor driver for controlling the position of the deflector based on the various temperature parameters selected. Thus, in this embodiment, a single constant speed fan may be used for cooling an entire package with individual deflectors providing local cooling control for each module or chip.

In all of the embodiments described above, instead of monitoring the chip temperature directly, indirect ways such as monitoring the supply current to the chip can be used as the control parameter to determine the cooling rate required. In this embodiment, the relationship between the chip temperature and power is first determined through modeling and experiments and programmed into the controller circuit.

The present invention provides means to maintain a constant chip temperature and prolong the life of semiconductor packages, especially those using high power CMOS chips in environments where significant on-off cycling is employed for power management.

While the invention has been particularly shown and described with respect to preferred embodiments thereof, it will be understood by those skilled in the art that the foregoing and other changes in formal details may be made therein without departing from the spirit and scope of the invention.

Having thus described our invention, what we claim as new, and desire to secure by Letters Patent is:

1. An apparatus for actively cooling a semiconductor chip module comprising:

a semiconductor chip module secured to a printed circuit board;

a heat sink thermally secured to said module;

variable air flow means for directing air flow over said heat sink;

means for monitoring the temperature difference between the module and the printed current board; and control means for connecting the means for monitoring the temperature difference between the module and the printed circuit board and the variable air flow means to regulate the air flow to maintain the temperature difference at a preset value.

2. The apparatus of claim 1 wherein said variable air flow means is a variable speed fan.

3. The apparatus of claim 1 wherein said variable air flow means is a variable direction baffle and a fan.

4. The apparatus of claim 1 wherein said means for monitoring the temperature difference between the module and the printed circuit board module is a separate temperature sensor in thermal contact with each of said module and board.

5. The apparatus of claim 1 wherein said means for monitoring the temperature difference between the module and the printed circuit board including a temperature sensor in thermal contact with said board and means for sensing the supply current to a semiconductor chip attached to said module.

6. The apparatus of claim 1 further including means for monitoring the temperature of a semiconductor chip mounted in said module and wherein said control means also regulates the air flow to maintain the chip temperature at a substantially constant temperature.

7. A method for actively cooling a semiconductor chip module comprising the steps of:

monitoring the temperature difference between a semiconductor chip module and a printed circuit board on which the module is mounted; and varying the air flow over a heat sink in thermal contact with said module in response to said temperature difference to maintain said temperature difference at a preset value.

8. The method of claim 7 wherein the step of varying the air flow over a heat sink includes varying the speed of a variable speed fan.

9. The method of claim 7 wherein the step of varying the air flow over a heat sink includes varying the direction of a baffle position between the heat sink and a fan.

10. The method of claim 7 further including the step of monitoring the present temperature of a chip attached to said module and varying the air flow over the heat sink to maintain the temperature of the chip at a substantially constant temperature.

* * * * *